United States Patent
Kato et al.

(10) Patent No.: US 8,048,611 B2
(45) Date of Patent: Nov. 1, 2011

(54) POLYORGANOSILOXANE, RESIN COMPOSITION, AND PATTERNING PROCESS

(75) Inventors: Hideto Kato, Annaka (JP); Tomoyoshi Furihata, Annaka (JP); Masahiro Furuya, Annaka (JP); Yoshinori Hirano, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 230 days.

(21) Appl. No.: 12/429,282

(22) Filed: Apr. 24, 2009

(65) Prior Publication Data

US 2009/0269697 A1    Oct. 29, 2009

(30) Foreign Application Priority Data

Apr. 25, 2008    (JP) ................. 2008-115514

(51) Int. Cl.
*G03F 7/00* (2006.01)
*G03F 7/004* (2006.01)

(52) U.S. Cl. ..................... 430/270.1; 430/311; 430/331; 430/913

(58) Field of Classification Search ............... 430/270.1, 430/311, 331, 913
See application file for complete search history.

(56) References Cited

U.S. PATENT DOCUMENTS

| | | | |
|---|---|---|---|
| 5,143,816 A | 9/1992 | Mizutani et al. | |
| 6,309,796 B1 | 10/2001 | Nakashima et al. | |
| 6,730,453 B2 * | 5/2004 | Nakashima et al. | 430/270.1 |
| 6,939,667 B2 * | 9/2005 | Taima | 430/567 |
| 7,132,220 B2 * | 11/2006 | Arai et al. | 430/287.1 |
| 7,439,010 B2 | 10/2008 | Watanabe et al. | |
| 7,625,687 B2 * | 12/2009 | Hu et al. | 430/270.1 |
| 2003/0114581 A1 | 6/2003 | Bowen, III et al. | |
| 2003/0191268 A1 | 10/2003 | Iwasawa et al. | |
| 2003/0224286 A1 | 12/2003 | Barclay et al. | |
| 2009/0068586 A1 * | 3/2009 | Nakamura et al. | 430/270.1 |
| 2009/0293858 A1 * | 12/2009 | Krasznai | 126/25 R |
| 2010/0071818 A1 * | 3/2010 | Hergenrother et al. | 152/209.1 |

FOREIGN PATENT DOCUMENTS

| | | |
|---|---|---|
| JP | 3-059667 A | 3/1991 |
| JP | 3-175514 A | 7/1991 |
| JP | 7-098502 A | 4/1995 |
| JP | 8-160623 A | 6/1996 |
| JP | 11-060733 A | 3/1999 |
| JP | 2003-255546 A | 9/2003 |
| JP | 2004-240144 A | 8/2004 |
| JP | 2007-041361 A | 2/2007 |

OTHER PUBLICATIONS

Machine translation of JP 08-160623 (no date).*
European Search Report dated Aug. 19, 2009, issued in corresponding European Patent Application No. 09251181.5.
Shostakovskii, M.F. et al.; "Synthesis and transformations of oxygen-containing silicoorganic compounds. Synthesis of methyl, ethyl, and isopropyl triethylsilano acetals"; Database CA [Online], Chemical Abstracts Service, Apr. 22, 2001, XP002540191 retrieved from STN Database accession No. 1955: 7872 Columbus, Ohio.
Y. Kawai et al, "Characteristics of a Chemically Amplified Silicone-Based Negative Resist (CSNR) in KrF Excimer Laser Litography", Advances in Resist Technology and Processing, 1992, pp. 56-65, vol. 1672.

* cited by examiner

*Primary Examiner* — Amanda C. Walke
(74) *Attorney, Agent, or Firm* — Westerman, Hattori, Daniels & Adrian, LLP

(57) ABSTRACT

A polyorganosiloxane compound is modified such that some silicon-bonded hydroxyl groups are substituted with acid labile groups and/or intermolecular or intramolecular crosslinks form with a crosslinking group having a C—O—C linkage. Cured films of a composition comprising the polyorganosiloxane are useful as interlayer dielectric films on TFT substrates.

5 Claims, No Drawings

POLYORGANOSILOXANE, RESIN COMPOSITION, AND PATTERNING PROCESS

CROSS-REFERENCE TO RELATED APPLICATION

This non-provisional application claims priority under 35 U.S.C. §119(a) on Patent Application No. 2008-115514 filed in Japan on Apr. 25, 2008, the entire contents of which are hereby incorporated by reference.

TECHNICAL FIELD

This invention relates to novel polyorganosiloxane compounds, photosensitive or heat-curable resin compositions comprising the same, and a patterning process. The resin compositions are used to form protective coatings which are suited for use with substrates, circuit boards and wiring boards. Due to their heat resistance, chemical resistance, electrical insulation and flexibility, these protective coatings are useful as protective dielectric films on semiconductor devices, semiconductor device rewiring dielectric films, dielectric films in multilayer printed circuit boards, solder protective films, coverlays, and board lamination films.

BACKGROUND ART

Siloxane polymers are known to be fully resistant to dry etching and plasma. The use of siloxane polymers as resist material has been reported in the literature.

One example is a composition comprising an organosiloxane having many silanol groups and a compound capable of generating an acid in response to light. While the silanol groups serve as an alkali-soluble group, the acid generated upon light exposure acts as a silanol condensation catalyst. Thus light-irradiated areas undergo condensation cure, forming a negative pattern. See Proc. SPIE 1672, 56 (1992).

Also known is a positive resist material based on an organopolysiloxane of siloxane bond backbone wherein organic groups bonded to silicon have hydroxyl groups, some hydrogen atoms of which are substituted by acid labile groups. Exemplary are a resist resin composition comprising a polyorganosilsesquioxane having acid-labile ester groups on side chains (JP-A 11-60733) and a resist composition comprising poly(2-hydroxycarbonylethyl)siloxane in which some hydroxyl groups are protected with acid labile groups (JP 3175514). These resist compositions using conventional siloxane polymers do not fully meet the properties required of resist materials including resolution, sensitivity and development performance.

Interlayer dielectric films and pattern-forming materials currently used with TFTs in LCDs are required to have high heat resistance, high transparency, low dielectric constant and solvent resistance. Prior art materials known to meet such properties include a positive heat-curable photosensitive composition comprising an alkali-soluble phenolic resin, a quinonediazide compound, a heat curing agent, and an acetate solvent having a boiling point of up to 150° C. (JP-A 7-98502) and a positive photosensitive resin composition comprising an alkali-soluble phenolic resin, a quinonediazide compound, a crosslinking agent, and a thermoacid generator (JP-A 2004-240144). However, these materials may have poor heat resistance and transparency and sometimes lack chemical resistance.

On the other hand, a certain material is designed to take advantage of the heat resistance, low dielectric constant and similar characteristics siloxane polymers possess. Examples include a photosensitive composition comprising a polysiloxane compound containing siloxane units derived from a cyclization addition reaction product and a quinonediazide compound (JP 2648969), a positive resist composition comprising an alkali-soluble siloxane polymer having phenolic hydroxyl groups and a quinonediazide compound (JP-A 2003-255546), and a photosensitive resin composition comprising a siloxane polymer, a quinonediazide compound, finely divided silica, and a solvent (JP-A 2007-41361). However, these compositions, when heat cured, can be colored with decomposition products of the quinonediazide compound, resulting in cured films becoming less transparent.

SUMMARY OF INVENTION

An object of the invention is to provide novel polyorganosiloxane compounds suitable as a base resin in photosensitive compositions; photosensitive or heat-curable resin compositions comprising the same which are sensitive to ultraviolet radiation such as g-line, i-line, and typically KrF or ArF excimer laser, and have a high sensitivity and process amenability; and a patterning process.

Using the heat-curable resin compositions, fine size patterns can be formed. After the pattern formation, they can be converted into films having high transparency in the visible spectrum through heat treatment at a relatively low temperature of the order of 200° C. The resulting films have good film characteristics and high reliability as a protective coating so that they are widely applicable for the protection of various circuit boards.

The inventors have found that a polyorganosiloxane compound having the average compositional formula (1) becomes effective when some hydrogen atoms of silicon-bonded hydroxyl groups are substituted by acid labile groups of the general formula (2), or are crosslinked within the molecule or between molecules with a crosslinking group having a C—O—C linkage represented by the general formula (3), or are both substituted by acid labile groups having the general formula (2) and crosslinked within the molecule or between molecules with a crosslinking group having a C—O—C linkage represented by the general formula (3), and when the compound has a weight average molecular weight of 300 to 200,000.

In a first aspect, the invention provides a polyorganosiloxane compound having the average compositional formula (1) which is modified such that some hydrogen atoms of silicon-bonded hydroxyl groups are substituted by acid labile groups of the general formula (2) and/or are crosslinked within the molecule or between molecules with a crosslinking group having a C—O—C linkage represented by the general formula (3), the polyorganosiloxane compound having a weight average molecular weight of 300 to 200,000 as measured by GPC versus polystyrene standards.

$$R^1_a Si(OR^2)_b(OH)_c O_{(4-a-b-c)/2} \tag{1}$$

Herein $R^1$ is one or more groups selected from hydrogen and $C_1$-$C_{18}$ organic groups, $R^2$ is one or more groups selected from straight or branched $C_1$-$C_6$ alkyl groups, a, b and c are numbers in the range: $0.3 \leq a \leq 1.6$, $0 \leq b \leq 0.3$, and $0.001 \leq c \leq 2$.

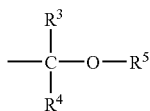

(2)

Herein $R^3$ and $R^4$ are each independently hydrogen or a straight, branched or cyclic $C_1$-$C_6$ alkyl group, $R^5$ is a straight, branched or cyclic $C_1$-$C_{30}$ alkyl group, $C_6$-$C_{20}$ aryl group or $C_7$-$C_{20}$ aralkyl group, or $R^3$ and $R^4$, $R^3$ and $R^5$, or $R^4$ and $R^5$ may bond together to form a ring with the carbon atom or carbon and oxygen atoms to which they are attached, wherein ring-forming $R^3$, $R^4$ or $R^5$ is a straight or branched $C_1$-$C_{18}$ alkylene group.

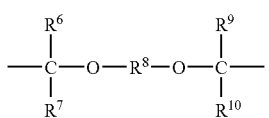

(3)

Herein $R^6$, $R^7$, $R^9$ and $R^{10}$ are each independently hydrogen or a straight, branched or cyclic $C_1$-$C_6$ alkyl group, or $R^6$ and $R^7$, or $R^9$ and $R^{10}$ may bond together to form a ring with the carbon atom to which they are attached, wherein ring-forming $R^6$, $R^7$, $R^9$ or $R^{10}$ is a straight or branched $C_1$-$C_{17}$ alkylene group, and $R^8$ is a divalent $C_1$-$C_6$ hydrocarbon group which may contain an oxygen atom.

In a second aspect, the invention provides a photosensitive resin composition comprising (A) the polyorganosiloxane compound defined above, and (B) a photoacid generator capable of generating an acid upon exposure to radiation in the wavelength range of 150 to 450 nm.

In a third aspect, the invention provides a heat-curable resin composition comprising (A) the polyorganosiloxane compound defined above, (B) a photoacid generator capable of generating an acid upon exposure to radiation in the wavelength range of 150 to 450 nm, and (C) a heat curing agent.

In a fourth aspect, the invention provides a pattern forming process comprising the steps of:

(i) applying the photosensitive resin composition onto a substrate to form a resist film, (ii) exposing the resist film to radiation in the wavelength range of 150 to 450 nm through a photomask, and (iii) developing the exposed resist film in an alkaline aqueous solution developer.

In a fifth aspect, the invention provides a pattern forming process comprising the steps of:

(i) applying the heat-curable resin composition onto a substrate to form a resist film, (ii) exposing the resist film to radiation in the wavelength range of 150 to 450 nm through a photomask, (iii) developing the exposed resist film in an alkaline aqueous solution developer for forming a patterned resist film, and (iv) heating the patterned resist film at a temperature of 100 to 250° C. for curing.

ADVANTAGEOUS EFFECTS OF INVENTION

From the radiation-sensitive resin compositions (specifically photosensitive or heat-curable resin compositions) of the invention, fine size patterns can be formed at a high resolution. After the pattern formation, they can be heat cured into films having good heat resistance, transparency, low dielectric constant and solvent resistance, and thus finding use as interlayer dielectric films on TFT substrates.

DESCRIPTION OF EMBODIMENTS

The polyorganosiloxane compound of the invention is synthesized from a precursor polysiloxane having the average compositional formula (1):

$$R^1{}_a Si(OR^2)_b(OH)_c O_{(4-a-b-c)/2} \quad (1)$$

wherein $R^1$ is one or more groups selected from hydrogen and $C_1$-$C_{18}$ organic groups, $R^2$ is one or more groups selected from straight or branched $C_1$-$C_6$ alkyl groups, a, b and c are numbers in the range: $0.3 \leq a \leq 1.6$, $0 \leq b \leq 0.3$, and $0.001 \leq c \leq 2$, specifically $0.01 \leq c \leq 2$. In one embodiment, some silanol groups in the precursor polysiloxane are substituted by acid labile groups. As used herein, the term "precursor polysiloxane" refers to a polyorganosiloxane prior to substitution of silanol groups by acid labile groups.

First, the precursor polysiloxane is described. In average compositional formula (1) representing the precursor polysiloxane, $R^1$ denotes hydrogen or substituted or unsubstituted monovalent hydrocarbon groups of 1 to 18 carbon atoms, preferably 1 to 10 carbon atoms, for example, hydrogen; alkyl groups such as methyl, ethyl, propyl, butyl, pentyl, hexyl, heptyl, and octyl; cycloalkyl groups such as cyclopentyl, cyclohexyl and norbornyl; alkenyl groups such as vinyl and allyl; aryl groups such as phenyl and naphthyl; halo-substituted hydrocarbon groups such as chloromethyl, γ-chloropropyl and 3,3,3-trifluoropropyl; and (meth)acryloxy, epoxy, mercapto and amino-substituted hydrocarbon groups such as γ-(meth)acryloxypropyl, γ-glycidoxypropyl, 3,4-epoxycyclohexylethyl, γ-mercaptopropyl, and γ-aminopropyl. Inter alia, methyl, propyl, cyclohexyl, norbornyl, phenyl and 3,4-epoxycyclohexylethyl are preferred. The essential inclusion of phenyl is most preferred because cured products become more flexible.

If the content "a" of $R^1$ is less than 0.3, then the content of tetrafunctional siloxane units becomes so greater that the film is more likely to crack. If "a" is more than 1.6, then the content of difunctional siloxane units is increased to impart flexibility to the film, but undesirably the content of silanol groups, which are essential to achieve substrate adhesion and alkali solubility, becomes lower.

$R^2$ denotes a straight or branched $C_1$-$C_6$ alkyl group. $OR^2$ groups are those of siloxane end groups other than silanol (Si—OH) groups. Some $OR^2$ groups are alkoxy residues originating from alkoxysilanes from which the precursor polysiloxane is prepared, and others are produced as a result of an alcohol used as a reaction medium during synthesis of the precursor polysiloxane being incorporated into siloxane. Exemplary $OR^2$ groups include methoxy, ethoxy, propoxy and butoxy. Since methoxysilanes and ethoxysilanes which are inexpensive are often used as the reactant from which polyorganosiloxane is prepared, $OR^2$ groups are mostly methoxy and ethoxy groups, but not limited thereto.

Acid labile groups are introduced into the precursor polysiloxane by reaction of silanol groups with an acid labile group-providing reactant. Since no alkoxy residues participate in this reaction, the content "b" of $OR^2$ may be equal to 0. If "b" is more than 0.3, then the proportion of alkoxy residues among end groups is increased and the total amount of silanol groups is accordingly reduced so that acid labile groups may be introduced in an amount insufficient to provide resolution.

The amount of alkoxy residues can be quantitatively determined by infrared absorption spectroscopy or via alcohol determination by alkali cracking. In practice, alkoxy residue contents below the measurement limit are acceptable.

The content "c" of silanol groups may be determined by analyzing the precursor polysiloxane by $^{29}$Si-NMR, and computing an average chemical structure thereof. Specifically, for example, T units ($R^1Si$—$O_{3/2}$) synthesized from a trifunctional hydrolyzable silane include four types of structural units T0 to T3, as shown below, whose signals are observable at different chemical sifts in a $^{29}$Si-NMR spectrum. Since the area of a signal designates an inclusion ratio of the corresponding structure, an amount (mole percent) of end groups (OX) can be computed from the inclusion ratios of T0, T1 and T2. By subtracting from this amount an alkoxy residue content determined separately by IR spectroscopy or the like, the amount (mole) of silanol groups in the polysiloxane can be computed.

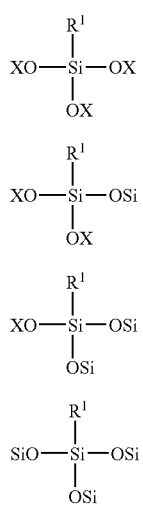

Herein X=H or $R^2$, and $R^1$ is as defined above.

If the content "c" of silanol (Si—OH) groups is more than 2, then the polysiloxane has an increased content of tetrafunctional siloxane units (Q) or corresponds to a dimer structure consisting of trifunctional siloxane units (T) with silanol groups on all ends. Such a polysiloxane has a low molecular weight and a poor film-forming ability, resulting in a cured film having poor crack resistance. If c is less than 0.001, then the content of acid labile groups to be introduced by the substitution as proposed herein becomes so low that the desired radiation sensitivity may not be achieved.

The molecular weight of the precursor polysiloxane can be measured by gel permeation chromatography (GPC). Preferably the precursor polysiloxane has a weight average molecular weight (Mw) of 300 to 200,000, as determined from the calibration curve drawn on the basis of polystyrene standards. If Mw is less than 300, then film-forming ability and crack resistance may become poor. A polymer with a Mw in excess of 200,000 may have a substantially reduced solubility in developer during development.

The precursor polysiloxane may be synthesized by any prior art well-known methods. The starting reactant is a hydrolyzable silicon compound which may be selected from the following: those known as silane coupling agents, such as vinyltrichlorosilane, vinyltrimethoxysilane, vinyltriethoxysilane, vinylmethyldichlorosilane, vinylmethyldimethoxysilane, vinylmethyldiethoxysilane, 5-hexenyltrimethoxysilane, 3-glycidoxypropyltrimethoxysilane, 3-glycidoxypropyltriethoxysilane, 3-glycidoxypropylmethyldimethoxysilane, 3-glycidoxypropylmethyldiethoxysilane, 3-(meth)acryloxypropyltrimethoxysilane, 3-(meth)acryloxypropyltriethoxysilane, 3-(meth)acryloxypropylmethyldimethoxysilane, 3-(meth)acryloxypropylmethyldiethoxysilane, 2-(3,4-epoxycyclohexyl)ethyltrimethoxysilane, 2-(3,4-epoxycyclohexyl)ethyldimethoxymethylsilane, 2-(3,4-epoxycyclohexyl)ethyltriethoxysilane, 2-(3,4-epoxycyclohexyl)ethyldiethoxymethylsilane, 3-(4-vinylphenyl)propyltrimethoxysilane, 4-vinylphenylmethyltrimethoxysilane, 4-vinylphenyltrimethoxysilane, 3-aminopropyltrimethoxysilane, 3-aminopropyltriethoxysilane, 3-aminopropylmethyldimethoxysilane, 3-aminopropylmethyldiethoxysilane, 3-(2-aminoethyl)aminopropyltrimethoxysilane, 3-mercaptopropyltrimethoxysilane, 3-mercaptopropyltriethoxysilane, 3-mercaptopropylmethyldimethoxysilane, and 3-mercaptopropylmethyldiethoxysilane; as well as tetrachlorosilane, tetramethoxysilane, tetraethoxysilane, tetrabutoxysilane, methyltrichlorosilane, methyltrimethoxysilane, methyltriethoxysilane, methyltriisopropoxysilane, methyltributoxysilane, methyltriisopropenoxysilane, ethyltrichlorosilane, ethyltrimethoxysilane, ethyltriethoxysilane, propyltrichlorosilane, propyltrimethoxysilane, propyltriethoxysilane, butyltrichlorosilane, butyltrimethoxysilane, hexyltrichlorosilane, hexyltrimethoxysilane, decyltrichlorosilane, decyltrimethoxysilane, phenyltrichlorosilane, phenyltrimethoxysilane, cyclohexyltrichlorosilane, cyclohexyltrimethoxysilane, propylmethyldichlorosilane, propylmethyldimethoxysilane, hexylmethyldichlorosilane, hexylmethyldimethoxysilane, cyclohexylmethyldichlorosilane, cyclohexylmethyldimethoxysilane, phenylmethyldichlorosilane, and phenylmethyldimethoxysilane. Also useful are silicon compounds which are synthesized from hydrosilylation reaction of hydrogensilanes such as trichlorohydrogensilane, trimethoxyhydrogensilane and triethoxyhydrogensilane with organic groups having an unsaturated bond. These hydrolyzable silicon compounds may be used alone or in admixture.

The hydrolyzable group in the silicon compound is preferably methoxy or ethoxy. This choice is for ease of reaction control and to avoid use of chlorosilanes because residual halide ions are inadequate in the application intended herein.

As to the organic group, methyl, propyl, cyclohexyl, norbornyl, phenyl and 3,4-epoxycyclohexylethyl are preferred as previously described. Inter alia, phenyl and 3,4-epoxycyclohexylethyl are most preferred. It is thus recommended to use silicon compounds having such hydrolyzable groups and organic groups of choice as the starting reactant.

Through hydrolysis and condensation of the hydrolyzable silicon compound, a hydrolytic condensate is obtained which can be used herein. This may be typically accomplished by the method of hydrolyzing a hydrolyzable silane in water or in water and an organic solvent.

An amount of water used in hydrolysis is at least 1 mole, preferably at least 1.2 moles per mole of hydrolyzable groups. If the amount of water is less than 1 mole, hydrolysis of hydrolyzable groups proceeds only in part, and a relatively large fraction of hydrolyzable groups are left unreacted. As more hydrolyzable groups are left unreacted, the amount of silanol groups is accordingly reduced, which is inadequate for the objects of the invention.

The organic solvent used herein may be selected from a wide variety of solvents which may be either water soluble or insoluble. Of these, polar solvents are preferred because of a high solubility of silanol group-containing siloxane therein. Suitable solvents include alcohols such as methanol, ethanol, propanol, isopropanol, butanol, isobutanol, t-butanol, and diacetone alcohol; and glycols such as ethylene glycol, monoethylene glycol monoether, propylene glycol, and propylene glycol monoether. In particular, low-boiling alcohols such as methanol and ethanol are preferred because they can be readily distilled off and polysiloxanes suited for the invention are obtainable.

For hydrolysis and subsequent condensation reactions, any prior art well-known hydrolysis catalysts and condensation catalysts may be used. Preferred catalysts include acidic hydrogen halides, carboxylic acids, and sulfonic acids, acidic or weakly acidic inorganic salts and solid acids such as ion-exchange resins. Illustrative examples include mineral acids such as hydrochloric acid, nitric acid and sulfuric acid, organic acids such as acetic acid, maleic acid, oxalic acid and methanesulfonic acid, and cation exchange resins having sulfonate or carboxylate groups on their surface. The hydrolytic catalyst is preferably used in an amount of 0.001 to 10 mol % based on the moles of hydrolyzable groups. In the practice of the invention, acetic acid, oxalic acid and other organic acids which are decomposable on heating are preferred.

Strictly stated, the hydrolysis and condensation reactions are not distinguishable in that condensation takes place in part even during hydrolysis reaction. Therefore, an acidic catalyst may function as the catalyst during both the reactions, although a condensation catalyst may be added separately if it is desired to enhance the degree of condensation. Examples of the condensation catalyst include acidic compounds as listed above, basic compounds and ammonium salts such as ammonia and amines, and compounds of metals such as titanium, zinc, zirconium and tin.

Described below is how to substitute acid labile groups for silanol groups on the precursor polysiloxane. The polyorganosiloxane compound of the invention is a modified form of polyorganosiloxane (precursor polysiloxane) having average compositional formula (1), in which some hydrogen atoms of silicon-bonded hydroxyl groups are substituted by acid labile groups having the general formula (2), or are crosslinked within the molecule or between molecules with a crosslinking group having a C—O—C linkage represented by the general formula (3), or are both substituted by acid labile groups having the general formula (2) and crosslinked within the molecule or between molecules with a crosslinking group having a C—O—C linkage represented by the general formula (3).

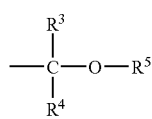

(2)

Herein $R^3$ and $R^4$ are each independently hydrogen or a straight, branched or cyclic $C_1$-$C_6$ alkyl group, $R^5$ is a straight, branched or cyclic $C_1$-$C_{30}$ alkyl group, $C_6$-$C_{20}$ aryl group or $C_7$-$C_{20}$ aralkyl group, or $R^3$ and $R^4$, $R^3$ and $R^5$, or $R^4$ and $R^5$ may bond together to form a ring with the carbon atom or carbon and oxygen atoms to which they are attached, each participant of $R^3$, $R^4$ and $R^5$ is a straight or branched $C_1$-$C_{18}$ alkylene group when they form a ring.

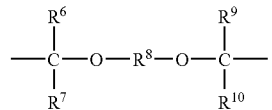

(3)

Herein $R^6$, $R^7$, $R^9$ and $R^{10}$ are each independently hydrogen or a straight, branched or cyclic $C_1$-$C_6$ alkyl group, or $R^6$ and $R^7$, or $R^9$ and $R^{10}$ may bond together to form a ring with the carbon atom to which they are attached, each participant of $R^6$, $R^7$, $R^9$ and $R^{10}$ is a straight or branched $C_1$-$C_{17}$ alkylene group when they form a ring. $R^8$ is a divalent $C_1$-$C_6$ hydrocarbon group which may contain an oxygen atom.

In the acid labile group of formula (2), examples of the $C_1$-$C_6$ alkyl group represented by $R^3$ and $R^4$ include methyl, ethyl, n-propyl, isopropyl, n-butyl, isobutyl, tert-butyl, n-pentyl, isopentyl, neopentyl, hexyl, cyclopentyl, and cyclohexyl.

Of the groups represented by $R^5$, exemplary straight, branched or cyclic $C_1$-$C_{30}$ alkyl groups include methyl, ethyl, propyl, isopropyl, n-butyl, isobutyl, tert-butyl, n-pentyl, isopentyl, neopentyl, n-hexyl, n-heptyl, n-octyl, n-decyl, n-dodecyl, n-hexyl, palmityl, n-stearyl, cyclopropyl, cholesteryl, tetrahydropyranyl, and tetrahydrofuranyl. Exemplary $C_6$-$C_{20}$ aryl groups include phenyl, tolyl, ethylphenyl, propylphenyl, dimethylphenyl, methylethylphenyl, naphthyl, furyl, and biphenyl. Exemplary $C_7$-$C_{20}$ aralkyl groups include benzyl, methylbenzyl, propylbenzyl and dimethylbenzyl.

In formula (3), examples of the straight, branched or cyclic $C_1$-$C_6$ alkyl groups represented by $R^6$, $R^7$, $R^9$ and $R^{10}$ include methyl, ethyl, propyl, isopropyl, n-butyl, isobutyl, tert-butyl, n-pentyl, isopentyl, neopentyl, n-hexyl, cyclohexyl, and cyclopentyl. $R^8$ denotes a divalent $C_1$-$C_6$ hydrocarbon group which may contain an oxygen atom, examples of which include alkylene groups and the following.

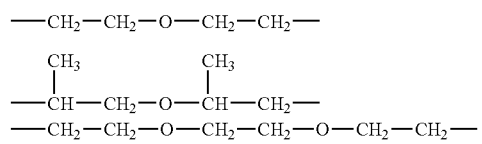

In formulae (2) and (3), when $R^3$, $R^4$ and $R^5$, or $R^6$, $R^7$, $R^9$ and $R^{10}$ form a ring, exemplary rings are tetrahydropyranyl and tetrahydrofuranyl.

The novel polyorganosiloxane compound of the invention may be obtained from addition reaction of the precursor polysiloxane with an alkenyl ether compound or dialkenyl ether compound in the presence of an acid catalyst. Suitable alkenyl ether compounds include methyl vinyl ether, ethyl vinyl ether, n-propyl vinyl ether, isopropyl vinyl ether, n-butyl vinyl ether, isobutyl vinyl ether, sec-butyl vinyl ether, ethyl-1-propenyl ether, cyclohexyl vinyl ether, methyl-1-propenyl ether, isopropenyl methyl ether, isopropenyl ethyl ether, dihydrofuran, and dihydropyran. Suitable dialkenyl ether compounds include ethylene glycol divinyl ether, triethylene glycol divinyl ether, 1,3-propanediol divinyl ether, 1,3-butanediol divinyl ether, 1,4-butanediol divinyl ether, neopentylglycol divinyl ether, hexane diol divinyl ether, 1,4- cyclohexanediol divinyl ether, pentaerythritol divinyl ether, and ethylene glycol diethylene vinyl ether.

The reaction to introduce acid labile groups may be conducted in a solvent which may be selected from aprotic polar solvents such as dimethylformamide, dimethylacetamide, tetrahydrofuran, 1,4-dioxane, and ethyl acetate, and mixtures thereof. Suitable acid catalysts include hydrochloric acid, sulfuric acid, trifluoromethanesulfonic acid, p-toluenesulfonic acid, methanesulfonic acid, and pyridinium p-toluenesulfonate.

The polyorganosiloxane compound of the invention is useful as a base resin in photosensitive resin compositions and heat-curable resin compositions, generally referred to as radiation-sensitive resin compositions. In another aspect, the invention provides a radiation-sensitive resin composition comprising the polyorganosiloxane compound defined above and a photoacid generator, dissolved in a solvent.

Specifically, the photosensitive resin composition is defined as comprising (A) the polyorganosiloxane compound, (B) a photoacid generator capable of generating an acid upon exposure to radiation in the wavelength range of 150 to 450 nm, and (D) a solvent.

The heat-curable resin composition is defined as comprising (A) the polyorganosiloxane compound, (B) a photoacid generator capable of generating an acid upon exposure to radiation in the wavelength range of 150 to 450 nm, (C) a heat curing agent, and (D) a solvent.

Now, the photoacid generator (B) is described in detail. The photoacid generators used herein include
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
bis(4-tert-butylphenyl)iodonium hexafluorophosphate, and
diphenyl(4-thiophenoxyphenyl)sulfonium hexafluoroantimonate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
is oxime sulfonate derivatives such as
α-(benzenesulfoniumoximino)-4-methylphenylacetonitrile;
β-keto-sulfone derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone and dicyclohexyl disulfone;
nitrobenzyl sulfonate derivatives such as
2,6-dinitrobenzyl p-toluenesulfonate and
2,4-dinitrobenzyl p-toluenesulfonate;
sulfonate derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
imidyl sulfonate derivatives such as
phthalimidyl triflate, phthalimidyl tosylate,
5-norbornene-2,3-dicarboximidyl triflate,
5-norbornene-2,3-dicarboximidyl tosylate,
5-norbornene-2,3-dicarboximidyl n-butylsulfonate, and
n-trifluoromethylsulfonyloxynaphthylimide.

Also included are imino sulfonates such as
(5-(4-methylphenyl)sulfonyloximino-5H-thiophen-2-ylidene)-(2-methylphenyl)acetonitrile and
(5-(4-(4-methylphenylsulfonyloxy)phenylsulfonyloximino)-5H-thiophen-2-ylidene)-(2-methylphenyl)-acetonitrile; and 2-methyl-2-[(4-methylphenyl)sulfonyl]-1-[(4-methylthio)-phenyl]-1-propane.

Inter alia, imidyl sulfonates, imino sulfonates and oxime sulfonates are more preferred.

The photoacid generators may be used alone or in admixture of two or more. The photoacid generator is preferably added in an amount of 0.05 to 20 parts, and more preferably 0.2 to 5 parts by weight per 100 parts by weight of the polyorganosiloxane compound. Less than 0.05 part of the photoacid generator may fail to provide a contrast (difference in dissolution rate in developer between exposed and unexposed areas) whereas more than 20 parts of the photoacid generator may exacerbate resolution due to photo-absorption of the generator itself.

The heat curing agent (C) used herein is not particularly limited as long as cure occurs by crosslinking due to condensation or addition reaction between silanol groups in the polyorganosiloxane or between molecules of the curing agent. Suitable heat curing agents include melamine compounds, glycoluril compounds, urea compounds, and epoxy compounds having on average at least two epoxy groups per molecule.

Examples of the melamine compound include hexamethylolmelamine hexamethyl ether, hexamethylolmelamine hexabutyl ether, tetramethoxymethylbenzoguanamine, and tetrabutoxymethylbenzoguanamine. Examples of the glycoluril compound include tetramethoxymethylglycoluril and tetrabutoxymethylglycoluril. Examples of the urea compound include tetramethoxymethylurea, dimethoxymethylethyleneurea, and dimethoxymethylpropyleneurea.

Suitable epoxy compounds having on average at least two epoxy groups per molecule include phenol novolac epoxy resins, cresol novolac epoxy resins, bisphenol A epoxy resins such as diglycidyl bisphenol A, bisphenol F epoxy resins such as diglycidyl bisphenol F, triphenylmethane type epoxy resins such as triphenylol propane triglycidyl ether, cycloaliphatic epoxy resins such as 3,4-epoxycyclohexylmethyl-3,4-epoxy-cyclohexane carboxylate, glycidyl ester resins such as diglycidyl phthalate, diglycidyl hexahydrophthalate and dimethylglycidyl phthalate, and glycidyl amine resins such as tetraglycidyldiaminodiphenylmethane, triglycidyl-p-aminophenol, diglycidylaniline, diglycidyltoluidine, and tetraglycidylbisaminomethylcyclohexane.

The heat curing agents may be used alone or in admixture of two or more. The curing agent is preferably added in an amount of 0.1 to 20 parts, and more preferably 2 to 10 parts by weight per 100 parts by weight of the polyorganosiloxane compound. Less than 0.1 part of the curing agent may fail to provide a satisfactory crosslinking density whereas more than 20 parts of the curing agent may exacerbate transparency due to photo-absorption of the agent itself and adversely affect storage stability.

The solvent (D) is not particularly limited as long as it is able to dissolve polyorganosiloxane (A), photoacid generator (B) and heat curing agent (C) and facilitates film coating. Suitable solvents include ketones such as cyclohexanone, cyclopentanone, and methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, which may be used alone or in admixture of two or more. Of these, ethyl lactate, cyclohexanone, cyclopentanone, PGMEA, γ-butyrolactone, and mixtures thereof are preferred because polyorganosiloxane (A), photoacid generator (B) and heat curing agent (C) are most soluble therein. Typically the solvent is used in an amount of 50 to 2,000 parts, and preferably 100 to 1,000 parts by weight per 100 parts by weight of all solids including components (A) to (C). Less than 50 parts of the solvent may be insufficient to keep components (A) to (C) compatible whereas more than 2,000 parts of the solvent keeps compatibility unchanged, but may give a resin solution having too low a viscosity to coat.

To the composition, any additive components other than the foregoing may be added. One typical additive component is a surfactant which is commonly used for facilitating coating operation. The surfactant may be added in an amount of 0.01 to 1 part by weight per 100 parts by weight of component (A). The preferred surfactants are nonionic surfactants including fluorochemical surfactants, such as perfluoroalkyl polyoxyethylene ethanols, fluorinated alkyl esters, perfluoroalkylamine oxides, and fluorinated organosiloxanes.

Such surfactants are commercially available, for example, under the trade name of Fluorad FC-4430 (Sumitomo-3M Co., Ltd.), Surflon S-141 and S-145 (Asahi Glass Co., Ltd.), Unidyne DS-401, DS-4031 and DS-451 (Daikin Industries Co., Ltd.), Megaface F-8151 (DIC Corp.), and X-70-093 (Shin-Etsu Chemical Co., Ltd.). Inter alia, Fluorad FC-4430 and X-70-093 are preferred.

As another additive component, a nitrogen-containing compound may be added for improving environmental stability, pattern profile and delay time stability. Suitable nitrogen-containing compounds include amines, especially secondary and tertiary aliphatic amines. Exemplary are diethylamine, di-n-propylamine, diethanol amine, trimethylamine, triethylamine, tri-n-propylamine, triethanol amine, and tripropanol amine.

Next, pattern formation using the radiation-sensitive resin composition is described. The radiation-sensitive resin composition is applied onto a substrate by any well-known techniques including dip coating, spin coating, and roll coating and prebaked by heating means such as a hot plate or oven, typically at 80 to 120° C. for 50 to 300 minutes, thus forming a resist film having a thickness of 0.5 to 20 μm. Using a radiation source such as a stepper or mask aligner, the resist film is then exposed to radiation having a wavelength in the range of 150 to 450 nm, for example, UV such as g-line and i-line, or deep UV (248 nm, 193 nm) through a photomask having the desired pattern. The exposure may be followed by heat treatment (PEB), typically at 90 to 130° C. for 50 to 300 minutes, if desired, for further enhancing development sensitivity.

After the exposure or PEB, the resist film is developed with a developer. The developer may be any well-known alkaline solution, typically an aqueous solution of tetramethylammonium hydroxide (TMAH). Development may be effected by a standard technique, for example, by dipping the resist film in the developer. The development is followed by optional washing, rinsing and drying. In this way, the resist film is processed into the desired pattern.

In the case of the heat-curable resin composition, the patterned film is then heated at 100 to 250° C. for 10 minutes to 10 hours in an oven or on a hot plate, thereby increasing a crosslinking density and removing residual volatile components. This results in a cured film having satisfactory heat resistance, transparency, low dielectric constant, and solvent resistance.

The films produced from the resin compositions of the invention by the above-described process have improved substrate adhesion, heat resistance, electrical insulation and mechanical properties and find use as protective coatings on electric and electronic parts and semiconductor devices. The films can be patterned to fine-size profiles. Because of improved substrate adhesion, electrical properties and mechanical properties, the films are advantageously used as semiconductor member protective coatings, inter-metal protective coatings, coverlays, and solder resists.

EXAMPLE

Examples of the invention are given below by way of illustration and not by way of limitation.

Synthesis Example 1

Synthesis of Polysiloxane A

A 1-L three-necked flask equipped with a thermometer, stirrer and condenser was charged with 89.2 g (0.45 mole) of phenyltrimethoxysilane, 110.9 g (0.45 mole) of 2-(3,4-epoxycyclohexyl)ethyltrimethoxysilane, and 360 g of methanol. With stirring and ice cooling below 10° C., 90 g of a 0.1M acetic acid aqueous solution was added dropwise from a dropping funnel to the flask. Hydrolytic condensation reaction took place with exothermic heat. The internal temperature was raised to room temperature, at which the solution was aged for 2 hours with stirring. With an ester adapter attached to the flask, methanol was distilled off at elevated temperature and atmospheric pressure. Distillation continued until the internal temperature exceeded the boiling point of methanol, leaving a white cloudy viscous polysiloxane solution. The amount of methanol collected at this point was 382 g. The polysiloxane solution was combined with 300 g of ethyl acetate, and the resulting solution was washed twice with deionized water. The polysiloxane solution was concentrated on a rotary evaporator, obtaining 233 g (solids concentration 62.2 wt %) of a colorless clear polysiloxane solution A.

This polysiloxane had a weight average molecular weight (Mw) of 4.2×10³ as measured by GPC versus polystyrene standards. On analysis by the alkali cracking method, no residual methoxy groups were detected. By $^{29}$Si-NMR spectroscopy, ratios of T0 to T3 incorporated were determined, from which the average compositional formula was computed as follows.

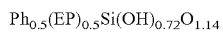

$Ph_{0.5}(EP)_{0.5}Si(OH)_{0.72}O_{1.14}$

EP: 2-(3,4-epoxycyclohexyl)ethyl
Ph: phenyl
Both Ph and EP groups belong to R¹. This corresponds to average compositional formula (1) wherein a=1.0, b=0, c=0.72.

Synthesis Example 2

Synthesis of Polysiloxane B

A 1-L three-necked flask equipped with a thermometer, stirrer and condenser was charged with 99.1 g (0.5 mole) of phenyltrimethoxysilane, 60.1 g (0.5 mole) of dimethyldimethoxysilane, and 277 g of methanol. With stirring and ice cooling below 10° C., 84 g of a 0.1M methanesulfonic acid aqueous solution was added dropwise from a dropping funnel to the flask. Hydrolytic condensation reaction took place with exothermic heat. The internal temperature was raised to room temperature, at which the solution was aged for 2 hours with stirring. With an ester adapter attached to the flask, methanol was distilled off at elevated temperature and atmospheric pressure. Distillation continued until the internal temperature exceeded the boiling point of methanol, leaving a white cloudy viscous polysiloxane solution. The amount of methanol collected at this point was 280 g. The polysiloxane solution was combined with 200 g of ethyl acetate, and the resulting solution was washed twice with deionized water. The polysiloxane solution was concentrated on a rotary evaporator, obtaining 185 g (solids concentration 60.5 wt %) of a colorless clear polysiloxane solution B.

This polysiloxane had a Mw of 3.8×10³ as measured by GPC versus polystyrene standards. On analysis by the alkali cracking method, no residual methoxy groups were detected. By $^{29}$Si-NMR spectroscopy, ratios of T0 to T3 incorporated were determined, from which the average compositional formula was computed as follows.

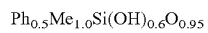

$Ph_{0.5}Me_{1.0}Si(OH)_{0.6}O_{0.95}$

Both Ph (phenyl) and Me (methyl) groups belong to R¹. This corresponds to average compositional formula (1) wherein a=1.5, b=0, c=0.6.

Synthesis Example 3

Synthesis of Polysiloxane C

A 1-L three-necked flask equipped with a thermometer, stirrer and condenser was charged with 98.9 g (0.65 mole) of tetramethoxysilane, 69.4 g (0.35 mole) of phenyltrimethoxysilane, and 360 g of methanol. With stirring and ice cooling below 10° C., 122 g of a 0.1M hydrochloric acid aqueous solution was added dropwise from a dropping funnel to the flask. Hydrolytic condensation reaction took place with exothermic heat. The internal temperature was raised to room temperature, at which the solution was aged for 2 hours with stirring. With an ester adapter attached to the flask, methanol was distilled off at elevated temperature and atmospheric pressure. Distillation continued until the internal temperature exceeded the boiling point of methanol, leaving a polysiloxane solution. The polysiloxane solution was combined with 200 g of ethyl acetate, and the resulting solution was washed twice with deionized water. The polysiloxane solution was concentrated on a rotary evaporator, obtaining 491 g (solids concentration 20.2 wt %) of a colorless clear polysiloxane solution C.

This polysiloxane had a Mw of 5.5×10³ as measured by GPC versus polystyrene standards. On analysis by the alkali cracking method, 1.0 wt % of residual methoxy groups were detected. By $^{29}$Si-NMR spectroscopy, ratios of T0 to T3 incorporated were determined, from which the average compositional formula was computed as follows.

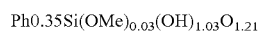

$Ph0.35Si(OMe)_{0.03}(OH)_{1.03}O_{1.21}$

This corresponds to average compositional formula (1) wherein a=0.35, b=0.03, c=1.03.

Synthesis Example 4

Synthesis of Acetalized Polysiloxane D

Solvent exchange was performed on 80.4 g of Polysiloxane A obtained in Synthesis Example 1 from its ethyl acetate solution to a tetrahydrofuran solution (solids concentration 20 wt %). A 1-L three-necked flask equipped with a thermometer, stirrer and condenser was charged with the THF solution, to which 1.0 g (0.01 mole) of methanesulfonic acid was added.

With stirring and ice cooling below 10° C., 19.4 g (0.23 mole) of ethyl-1-propenyl ether was added dropwise from a dropping funnel to the flask while its internal temperature was kept below 10° C. At the end of dropwise addition, reaction took place at room temperature for 2 hours. Triethylamine, 1.0 g (0.01 mole), was added to quench the reaction. The reaction solution was transferred to a 1-L eggplant flask coupled to a rotary evaporator where THF was distilled off at room temperature and reduced pressure. To the reaction solution, 300 g of methyl isobutyl ketone and 250 ml of 0.01N acetic acid aqueous solution were added for water washing. This washing operation was repeated three times. The organic layer was separated and concentrated on a rotary evaporator, yielding 49.0 g of colorless clear acetalized polysiloxane D.

This acetalized polysiloxane D had an acetal substitution of 32.5 mol %, as determined from $^{13}$C-NMR data.

Synthesis Example 5

Synthesis of Acetalized Polysiloxane E

Solvent exchange was performed on 80.4 g of Polysiloxane A obtained in Synthesis Example 1 from its ethyl acetate solution to a tetrahydrofuran solution (siloxane concentration 20 wt %). A 1-L three-necked flask equipped with a thermometer, stirrer and condenser was charged with the THF solution, to which 1.0 g (0.01 mole) of methanesulfonic acid was added.

With stirring and ice cooling below 10° C., 7.3 g (0.10 mole) of ethyl vinyl ether and 1.6 g (0.01 mole) of 1,4-butanediol divinyl ether were added dropwise from a dropping funnel to the flask while its internal temperature was kept below 10° C. At the end of dropwise addition, reaction took place at room temperature for 2 hours. Triethylamine, 1.0 g (0.01 mole), was added to quench the reaction. The reaction solution was transferred to a 1-L eggplant flask coupled to a rotary evaporator where THF was distilled off at room temperature and reduced pressure. To the reaction solution, 300 g of methyl isobutyl ketone and 250 ml of 0.01N acetic acid aqueous solution were added for water washing. This washing operation was repeated three times. The organic layer was separated and concentrated on a rotary evaporator, yielding 49.0 g of colorless clear acetalized polysiloxane E.

This acetalized polysiloxane E had an acetal substitution of 34.5 mol %, as determined from $^{13}$C-NMR data.

Synthesis Example 6

Synthesis of Acetalized Polysiloxane F

Solvent exchange was performed on 82.6 g of Polysiloxane B obtained in Synthesis Example 2 from its ethyl acetate solution to a tetrahydrofuran solution (siloxane concentration 20 wt %). A 1-L three-necked flask equipped with a thermometer, stirrer and condenser was charged with the THF solution, to which 1.0 g (0.01 mole) of methanesulfonic acid was added.

With stirring and ice cooling below 10° C., 23.6 g (0.28 mole) of 3,4-dihydro-2H-pyran was added dropwise from a dropping funnel to the flask while its internal temperature was kept below 10° C. At the end of dropwise addition, reaction took place at room temperature for 2 hours. Triethylamine, 1.0 g (0.01 mole), was added to quench the reaction. The reaction solution was transferred to a 1-L eggplant flask coupled to a rotary evaporator where THF was distilled off at room temperature and reduced pressure. To the reaction solution, 300 g of methyl isobutyl ketone and 250 ml of 0.01N acetic acid aqueous solution were added for water washing. This washing operation was repeated three times. The organic layer was separated and concentrated on a rotary evaporator, yielding 48.4 g of colorless clear acetalized polysiloxane F.

This acetalized polysiloxane F had an acetal substitution of 46.3 mol %, as determined from $^{13}$C-NMR data.

Synthesis Example 7

Synthesis of Acetalized Polysiloxane G

Solvent exchange was performed on 247.5 g of Polysiloxane C obtained in Synthesis Example 3 from its ethyl acetate solution to a tetrahydrofuran solution (siloxane concentration 20 wt %). A 1-L three-necked flask equipped with a thermometer stirrer and condenser was charged with the THF solution, to which 1.0 g (0.01 mole) of methanesulfonic acid was added.

With stirring and ice cooling below 10° C., 21.7 g (0.40 mole) of isobutyl vinyl ether and 10.6 g (0.1 mole) of 1,4-cyclohexane dimethanol divinyl ether were added dropwise from a dropping funnel to the flask while its internal temperature was kept below 10° C. At the end of dropwise addition, reaction took place at room temperature for 2 hours. Triethylamine, 1.0 g (0.01 mole), was added to quench the reaction. The reaction solution was transferred to a 1-L eggplant flask coupled to a rotary evaporator where THF was distilled off at room temperature and reduced pressure. To the reaction solution, 400 g of methyl isobutyl ketone and 250 ml of 0.01N acetic acid aqueous solution were added for water washing. This washing operation was repeated three times. The organic layer was separated and concentrated on a rotary evaporator, yielding 48.2 g of colorless clear acetalized polysiloxane G.

This acetalized polysiloxane G had an acetal substitution of 58.8 mol %, as determined from $^{13}$C-NMR data.

Example 1

In 14 g of cyclopentanone was dissolved 10 g of acetalized polysiloxane D in Synthesis Example 4. To the solution, 0.10 g of [5-(4-(4-methylphenylsulfonyloxy)phenyl-sulfonyloximino)-5H-thiophen-2-ylidene]-(2-methylphenyl)-acetonitrile as an acid generator and 0.01 g of surfactant X-70-093 (Shin-Etsu Chemical Co., Ltd.) were added and dissolved. This was filtrated through a membrane filter with a pore size of 0.2 μm, obtaining a resist solution.

The resist solution was coated onto a 6-inch silicon wafer by means of a spin coater and prebaked on a hot plate at 100° C. for 120 seconds to form a resist film of 4.0 μm thick. The resist film was exposed patternwise by means of an i-line stepper NSR-1755i7A (Nikon Corp., NA=0.5), puddle developed for 120 seconds in a 2.38 wt % tetramethylammonium hydroxide (TMAH) aqueous solution, and rinsed with deionized water.

The patterned resist film was evaluated. Using a scanning electron microscope (SEM) S-4100 (Hitachi, Ltd.), line-and-space patterns from 0.5 μm to 5.0 μm were observed, from which sensitivity, perpendicularity of pattern side walls, the presence of resist scum in spaces, and resolution in terms of minimum resolvable size (line-and-space) were determined.

Examples 2 to 4

As in Example 1, resist solutions were prepared and processed, followed by pattern evaluation. Table 1 shows the composition and Table 2 shows the results of pattern evaluation.

TABLE 1

| | Composition (weight) | | | |
|---|---|---|---|---|
| | Polyorganosiloxane compound | Acid generator | Surfactant | Solvent |
| Example 1 | Synthesis Example 4; D (10 g) | PAG1 (0.1 g) | X-70-093 (0.01 g) | cyclopentanone (14 g) |
| Example 2 | Synthesis Example 5; E (10 g) | PAG2 (0.1 g) | X-70-093 (0.01 g) | cyclopentanone (18 g) |
| Example 3 | Synthesis Example 6; F (10 g) | PAG1 (0.1 g) | X-70-093 (0.01 g) | cyclopentanone (15 g) |
| Example 4 | Synthesis Example 7; G (10 g) | PAG2 (0.1 g) | X-70-093 (0.01 g) | cyclopentanone (20 g) |

PAG1: [5-(4-(4-methylphenylsulfonyloxy)phenylsulfonyloximino)-5H-thiophen-2-ylidene]-(2-methylphenyl)-acetonitrile
PAG2: 4-methoxy-α-[[[(4-methylphenyl)sulfonyl]-oxy]imino]benzene-acetonitrile

TABLE 2

| | Pattern evaluation | | | |
|---|---|---|---|---|
| | Sensitivity Eth (mJ) | Side wall perpendicularity | Scum | Minimum resolvable L&S (μm) |
| Example 1 | 50 | perpendicular | nil | 0.5 |
| Example 2 | 85 | perpendicular | nil | 0.75 |
| Example 3 | 45 | substantially perpendicular | nil | 0.5 |
| Example 4 | 110 | substantially perpendicular | substantially nil | 1.0 |

Example 5

In 16 g of cyclopentanone was dissolved 10 g of acetalized polysiloxane D in Synthesis Example 4. To the solution, 0.10 g of [5-(4-(4-methylphenylsulfonyloxy)phenyl-sulfonyloximino)-5H-thiophen-2-ylidene]-(2-methylphenyl)-acetonitrile as an acid generator, 0.5 g of tetramethoxymethylglycoluril as a curing agent, and 0.01 g of surfactant X-70-093 were added and dissolved. This was filtrated through a membrane filter with a pore size of 0.2 μm, obtaining a resist solution.

As in Example 1, the resist solution was coated onto a 6-inch silicon wafer by means of a spin coater and prebaked on a hot plate at 100° C. for 120 seconds to form a resist film of 4.0 μm thick. The resist film was exposed patternwise by means of an i-line stepper NSR-1755i7A (Nikon Corp., NA=0.5), puddle developed for 120 seconds in a 2.38 wt % TMAH aqueous solution, and rinsed with deionized water.

The patterned resist film was evaluated. Using an SEM: S-4100 (Hitachi, Ltd.), line-and-space patterns from 0.5 μm to 5.0 μm were observed, from which sensitivity, perpendicularity of pattern side walls, the presence of resist scum in spaces, and resolution in terms of minimum resolvable size (line-and-space) were determined.

Solvent Resistance Test

As above, the resist solution was coated onto a silicon wafer by means of a spin coater and prebaked on a hot plate at 100° C. for 120 seconds to form a resist film of 4.0 μm thick. Likewise the resist film was exposed, dipped in a 2.38 wt % TMAH developer for 120 seconds, and rinsed with deionized water. The film left after the procedure was heated in an oven at 220° C. for one hour, obtaining a cured film of 3.5 μm thick. The wafer having the cured film borne thereon was immersed for 15 minutes in a mixture of 70 g 2-aminoethanol and 30 g dimethyl sulfoxide at 60° C. and rinsed with deionized water, after which the film thickness was measured. From the film thicknesses before and after immersion, a film retentivity was computed as an index of solvent resistance.

Transparency of Cured Film

The procedure of solvent resistance evaluation was repeated aside from using a quartz wafer. Specifically, the resist solution was coated onto a quartz wafer by means of a spin coater and prebaked on a hot plate at 100° C. for 120 seconds to form a resist film of 4.0 μm thick. Likewise the resist film was exposed, dipped in a 2.38 wt % TMAH developer for 120 seconds, and rinsed with deionized water. The film left after the procedure was heated in an oven at 220° C. for one hour, obtaining a cured film of 3.5 μm thick. Using a spectrophotometer U-3000 (Hitachi, Ltd.), the transmittance of the film was measured in a spectrum from 200 nm to 800 nm. The transmittance at 400 nm is used as an index of transparency.

Measurement of Dielectric Constant

The resist solution prepared as above was diluted with cyclopentanone to a resin solids concentration of 10 wt %. The solution was spin coated onto a 6-inch N-type silicon wafer and prebaked on a hot plate at 100° C. for 120 seconds for evaporating off the solvent. Likewise the resist film was exposed, dipped in a 2.38 wt % TMAH developer for 120 seconds, and rinsed with deionized water. The film left after the procedure was heated in an oven at 220° C. for one hour, obtaining a cured film of 0.8 μm thick. Using an automatic mercury CV measurement system (SSM 496 System by Solid State Measurement Inc.) with an automatic mercury probe, the dielectric constant of the cured film was measured by the CV method.

Examples 6 to 8

As in Example 5, resist solutions were prepared and processed, and evaluated with respect to pattern and physical properties. Table 3 shows the composition and Table 4 shows the test results of pattern and physical properties.

TABLE 3

| | Composition (weight) | | | | |
|---|---|---|---|---|---|
| | Polyorganosiloxane compound | Acid generator | Heat curing agent | Surfactant | Solvent |
| Example 5 | Synthesis Example 4; D (10 g) | PAG1 (0.1 g) | CL1 (0.5 g) | X-70-093 (0.01 g) | cyclopentanone (16 g) |
| Example 6 | Synthesis Example 5; E (10 g) | PAG2 (0.1 g) | CL1 (0.2 g) | X-70-093 (0.01 g) | cyclopentanone (19 g) |
| Example 7 | Synthesis Example 6; F (10 g) | PAG1 (0.1 g) | CL2 (0.5 g) | X-70-093 (0.01 g) | cyclopentanone (17 g) |

TABLE 3-continued

| | Composition (weight) | | | | |
|---|---|---|---|---|---|
| | Polyorganosiloxane compound | Acid generator | Heat curing agent | Surfactant | Solvent |
| Example 8 | Synthesis Example 7; G (10 g) | PAG2 (0.1 g) | CL2 (0.2 g) | X-70-093 (0.01 g) | cyclopentanone (19 g) |

PAG1: [5-(4-(4-methylphenylsulfonyloxy)phenylsulfonyloximino)-5H-thiophen-2-ylidene]-(2-methylphenyl)-acetonitrile
PAG2: 4-methoxy-α-[[[(4-methylphenyl)sulfonyl]-oxy]imino]benzene-acetonitrile
CL1: tetramethoxymethylglycoluril
CL2: triphenylolpropane triglycidyl ether

TABLE 4

| | Evaluation results of pattern and properties of heat cured film | | | | | | |
|---|---|---|---|---|---|---|---|
| | Sensitivity Eth (mJ) | Side wall perpendicularity | Scum | Minimum resolvable L&S (μm) | Film retentivity (%) | Transmittance (%) | Dielectric constant |
| Example 5 | 45 | perpendicular | nil | 0.5 | 99.5 | 96.0 | 3.31 |
| Example 6 | 80 | perpendicular | nil | 0.75 | 99.0 | 94.5 | 3.32 |
| Example 7 | 40 | substantially perpendicular | nil | 0.5 | 90.0 | 95.0 | 3.34 |
| Example 8 | 100 | substantially perpendicular | nil | 1.0 | 95.0 | 94.0 | 3.33 |

As seen from the foregoing results, the compositions of Examples 1 to 8 are satisfactory photosensitive materials because line-and-space patterns from 0.5 μm to 0.75 μm can be formed with advantages of no scum, perpendicular side walls, and a high resolution. The cured films from the compositions of Examples 5 to 8 possess good electric properties including dielectric strength and exhibit satisfactory properties including transparency and solvent resistance, proving their effectiveness as protective coatings on circuit boards and electronic parts.

Japanese Patent Application No. 2008-115514 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polyorganosiloxane compound having the average compositional formula (1) which is modified such that some hydrogen atoms of silicon-bonded hydroxyl groups are substituted by acid labile groups of the general formula (2) and/or are crosslinked within the molecule or between molecules with a crosslinking group having a C—O—C linkage represented by the general formula (3), said polyorganosiloxane compound having a weight average molecular weight of 300 to 200,000 as measured by GPC versus polystyrene standards,

wherein $R^1$ is one or more groups selected from hydrogen and $C_1$-$C_{18}$ organic groups, $R^2$ is one or more groups selected from straight or branched $C_1$-$C_6$ alkyl groups, a, b and c are numbers in the range: $0.3 \leq a \leq 1.6$, $0 \leq b \leq 0.3$, and $0.001 \leq c \leq 2$,

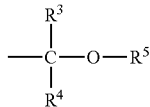

wherein $R^3$ and $R^4$ are each independently hydrogen or a straight, branched or cyclic $C_1$-$C_6$ alkyl group, $R^5$ is a straight, branched or cyclic $C_1$-$C_{30}$ alkyl group, $C_6$-$C_{20}$ aryl group or $C_7$-$C_{20}$ aralkyl group, or $R^3$ and $R^4$, $R^3$ and $R^5$, or $R^4$ and $R^5$ may bond together to form a ring with the carbon atom or carbon and oxygen atoms to which they are attached, wherein ring-forming $R^3$, $R^4$ or $R^5$ is a straight or branched $C_1$-$C_{18}$ alkylene group,

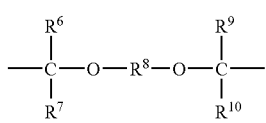

wherein $R^6$, $R^7$, $R9$ and $R^{10}$ are each independently hydrogen or a straight, branched or cyclic $C_1$-$C_6$ alkyl group, or $R^6$ and $R^7$, or $R^9$ and $R^{10}$ may bond together to form a ring with the carbon atom to which they are attached, wherein ring-forming $R^6$, $R^7$, $R^9$ or $R^{10}$ is a straight or branched $C_1$-$C_{17}$ alkylene group, and $R^8$ is a divalent $C_1$-$C_6$ hydrocarbon group which may contain an oxygen atom.

2. A photosensitive resin composition comprising
(A) the polyorganosiloxane compound of claim 1, and
(B) a photoacid generator capable of generating an acid upon exposure to radiation in the wavelength range of 150 to 450 nm.

3. A heat-curable resin composition comprising
(A) the polyorganosiloxane compound of claim 1,
(B) a photoacid generator capable of generating an acid upon exposure to radiation in the wavelength range of 150 to 450 nm, and
(C) a heat curing agent.

4. A pattern forming process comprising the steps of:
(i) applying the photosensitive resin composition of claim 2 onto a substrate to form a resist film,
(ii) exposing the resist film to radiation in the wavelength range of 150 to 450 nm through a photomask, and
(iii) developing the exposed resist film in an alkaline aqueous solution developer.

5. A pattern forming process comprising the steps of:
(i) applying the heat-curable resin composition of claim 3 onto a substrate to form a resist film,
(ii) exposing the resist film to radiation in the wavelength range of 150 to 450 nm through a photomask,
(iii) developing the exposed resist film in an alkaline aqueous solution developer for forming a patterned resist film, and
(iv) heating the patterned resist film at a temperature of 100 to 250° C. for curing.

* * * * *